United States Patent
Müller et al.

[11] Patent Number: 6,104,181
[45] Date of Patent: Aug. 15, 2000

[54] VOLTMETER SUITABLE FOR MEDIUM/HIGH-VOLTAGE INSTALLATIONS, WITH A SURFACE WAVE DEVICE

[75] Inventors: Ansgar Müller, Erlangen; Reinhard Maier, Herzogenaurach; Wolf-Eckhart Bulst, München; Thomas Ostertag, Finsing, all of Germany

[73] Assignee: Siemens Aktiengesellchaft, Munich, Germany

[21] Appl. No.: 09/043,242
[22] PCT Filed: Sep. 3, 1996
[86] PCT No.: PCT/DE96/01637
§ 371 Date: Jun. 11, 1998
§ 102(e) Date: Jun. 11, 1998
[87] PCT Pub. No.: WO97/09624
PCT Pub. Date: Mar. 13, 1997

[30] Foreign Application Priority Data

Sep. 4, 1995 [DE] Germany .......................... 195 32 600

[51] Int. Cl.[7] .................................................. G01R 19/00
[52] U.S. Cl. ........................................... 324/126; 324/127
[58] Field of Search ................... 324/126, 127, 324/72, 132, 109, 530

[56] References Cited

U.S. PATENT DOCUMENTS

| | | |
|---|---|---|
| 3,428,896 | 2/1969 | Schweitzer, Jr. . |
| 3,633,191 | 1/1972 | Engelhardt et al. . |
| 4,052,665 | 10/1977 | Gruenwald ............................ 324/530 |
| 4,121,154 | 10/1978 | Keating ................................ 324/126 |
| 4,158,810 | 6/1979 | Leskovar . |
| 4,233,573 | 11/1980 | Grudkowski ....................... 331/107 A |
| 4,261,818 | 4/1981 | Sweeney . |
| 4,510,443 | 4/1985 | Inaba et al. . |
| 4,611,207 | 9/1986 | Anderson et al. . |

FOREIGN PATENT DOCUMENTS

| | | |
|---|---|---|
| 0 166 065 | 2/1986 | European Pat. Off. . |
| 0 314 850 A1 | 10/1989 | European Pat. Off. . |
| 0 314 850 B1 | 10/1989 | European Pat. Off. . |
| 1 940 614 | 11/1971 | Germany . |

OTHER PUBLICATIONS

Bayer et al, Hochspannungstechnik [Power Electrical Engineering] Verlag Springer 1986, Chapter 10.6.3.2, pp. 313–317. (no month available)

*Primary Examiner*—Josie Ballato
*Assistant Examiner*—Minh Tang
*Attorney, Agent, or Firm*—Hill & Simpson

[57] ABSTRACT

Voltmeter for medium/high-voltage devices, which has a surface-wave device (21) as the voltmeter element proper. This surface-wave device is incorporated into an impedance voltage divider (5, 6), of a type known in principle, in such a way that both electrical high-voltage insulation is ensured and power supply problems of the voltmeter element which is at high potential are ruled out.

10 Claims, 2 Drawing Sheets

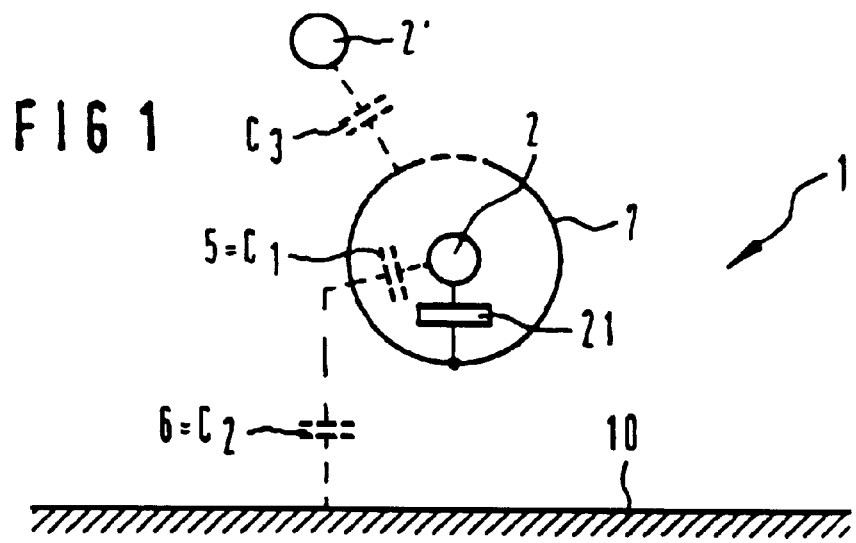
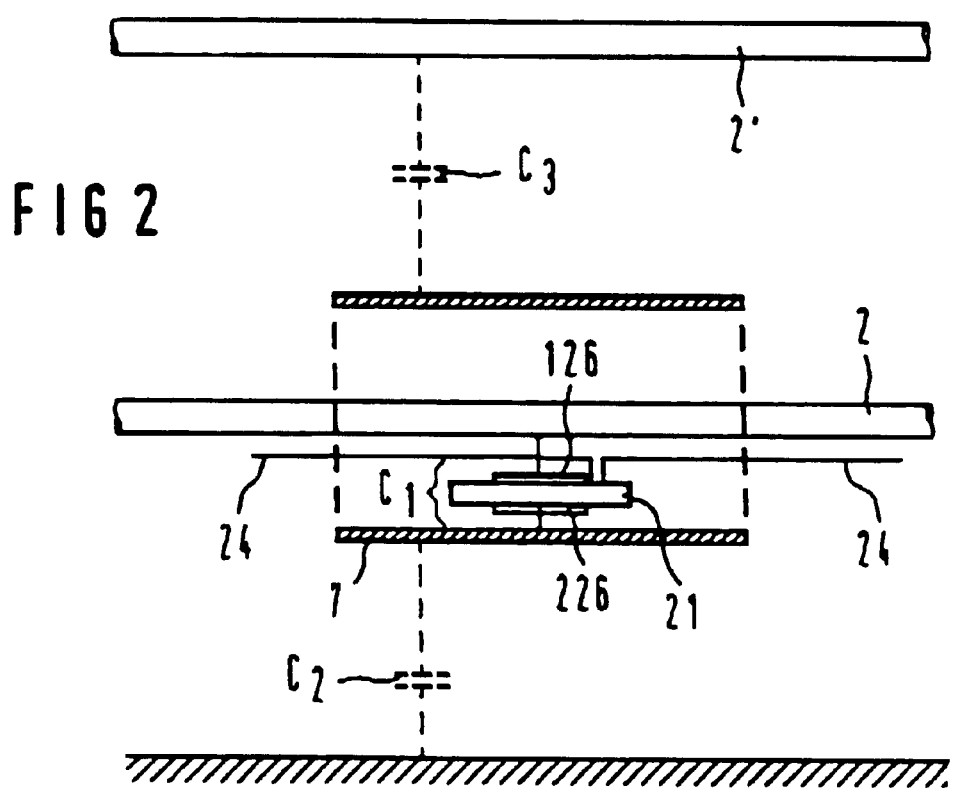

VOLTMETER SUITABLE FOR MEDIUM/HIGH-VOLTAGE INSTALLATIONS, WITH A SURFACE WAVE DEVICE

BACKGROUND OF THE INVENTION

Voltmeter, suitable for medium/high-voltage devices, having a surface-wave device.

The present invention relates to a voltmeter which is suitable for medium/high-voltage devices.

Many embodiments of high-voltage meters, based on various operating principles, are known. Many such meters operate on a magnetic principle, or with evaluation of the magnetic field of currents flowing in high-voltage devices. For all such devices, a problem to be observed or solved is that of ensuring sufficient high-voltage insulation and to rule out the high-voltage risks to operating personnel and the like which may occur with such meters.

High-voltage meters are, for example, disclosed in the U.S. Pat. Nos. 3,428,896, 3,633,191, 4,158,810 and 4,261,818 as well as in European reference EP-0 314 850 B1. In particular, the latter publication explains the problems which arise in conjunction with multi-conductor high-voltage systems such as three-phase high-voltage lines. This publication describes in detail relatively inexpensive measures by which effects on measurement values, due to the presence of neighbouring high-voltage conductors, can be solved or by which corrections may be made to measured values. This publication also sets out general facts relating to high-voltage meters, which need not therefore be repeated in the description of the present invention.

A decade ago, U.S. Pat. No. 4,611,207 disclosed the features of the precharacterizing clause of Patent a capacitive voltage divider which consists of two capacitors with, arranged between them, an electrically conductive surface element forming a potential surface of the voltage divider, and lies between the high-voltage electrical conductor and a base potential. Associated with these features, this document describes an electronic circuit as a voltmeter device with an amplifier stage and a downstream transmitter stage which necessarily require a power source for supplying them and, like the voltmeter device, are at high-voltage potential.

In a different context, actually a decade ago as well, European reference EP-AUS-0166065A1 and U.S. Pat. No. 4,510,443 disclosed mutually corresponding surface-wave voltmeter devices as described in more detail below.

SUMMARY OF THE INVENTION

The object of the present invention is to provide a voltmeter, suitable for medium/high-voltage devices, whose technical design is simplified, in particular with regard to the electrical insulation requirements as well. A further intention in this case is for the effect of neighbouring current-carrying or live conductors to be taken into account.

The principle of the voltmeter according to the invention is based on one of the type which operates in conjunction with or on the basis of an impedance voltage divider. In particular, this is a capacitive voltage divider. The intended voltage divider is provided inserted between an electrical conductor whose electrical voltage potential is to be measured relative to an electrical base potential, and this base potential. Further details of this can be found in the publication Bayer, Boeck, Möller and Zaengl "Hochspannungstechnik" (Power electrical Engineering) Verlag Springer 1986, Chapter 10.6.3.2, pages 313–317 and the description of the Figures.

The voltmeter according to the invention has a surface-wave device as the measuring element proper. In the case of the invention, the latter has the function of measuring an electrical voltage occurring across the voltage divider, namely a voltage whose electric field has a valuable effect on the wave propagation in the surface-wave device. The surface-wave device is a part of a capacitive voltmeter. Preferred embodiments of the invention have a capacitive voltage divider. With regard to further details of the surface-wave device, reference is likewise made to the description of the Figures.

In the invention, a voltage divider is also used for achieving a predeterminable or computable division of the occurring total electrical voltage to be measured, which is such that one voltage fraction is dimensioned so that it is suitable for evaluation with the surface-wave device.

The invention also consists in part in a particularly advantageous embodiment of such a voltage divider, the physical principle of which is also per se the prior art.

BRIEF DESCRIPTION OF THE HEADING

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows an outline structure according to the invention in side view, and

FIG. 2 shows a cross-sectional representation thereof.

DESCRIPTION OF THE PREFERRED EMBODIMENTS

Figure 3:
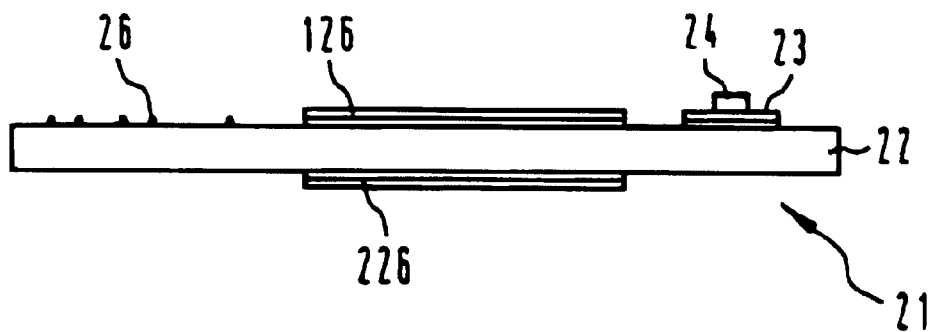
FIGS. 3 and 4 show a side view and a plan view of a surface-wave device used in the invention.

FIG. 1 shows a side view of a high-voltage line 2 and a particularly preferred embodiment of a voltmeter 1 according to the invention. With FIGS. 1 and 2, the invention and an application for measuring the electrical voltage of this line are described. 2' additionally denotes a further high-voltage line, running next to the high-voltage line 2, of a second phase of a, for example, 3-phase conductor system.

10 denotes the base potential, for example the earth potential of the surface of the earth.

The capacitive voltage divider used in this embodiment of the invention consists of two capacitors 5 and 6. The capacitor 5 is a constituent part of the voltmeter according to the invention. One electrode of this capacitor is the already mentioned high-voltage line 2, and the associated second electrode is an electrically conductive surface element 7 provided according to the invention. The latter has predeterminable surface dimensions and is arranged at a predeterminable distance from the high-voltage line 2. The high-voltage line 2 is the claimed conductor which is at the electrical voltage potential to be measured and may also be a different type of electrical conductor which is live (relative to a base potential). The intended electrically conductive surface element 7 preferably has the form of a fully or at least substantially closed sleeve 7 which at least approximately, preferably fully, encloses a corresponding portion of the high-voltage line 2. A sleeve which is not fully closed may, for example, also be subsequently fitted laterally on an already present high-voltage line 2.

The high-voltage line 2 and the sleeve 7 of the embodiment which is represented therefore form a first capacitor 5=C1 of the capacitive voltage divider which is preferably provided. A second (6) associated divider capacitor C2 is formed by the necessarily existing stray capacitance of the sleeve 7 with respect to the reference potential 10; in the case of an overhead high-voltage line, this is the surface of the earth. Corresponding dimensioning of the surface of the surface element, that is to say, in the embodiment of FIG. 1 of the sleeve 7, and dimensioning of the distance between the outer surface of the high-voltage line 2 and the inner surface of the sleeve 7, it is possible to select a capacitance for the capacitor C1, relative to the stray capacitance C2 which is virtually predetermined for these purposes, which makes it possible to select a voltage range to be evaluated which is suitably dimensioned for operation with the surface-wave device. For the special application case, the person skilled in the art is thus capable of specifying such a dimensioning of the surface element, that is to say of the sleeve 7 in this case, for which the range of electrical voltages occurring, applied to the capacitor C1, is favourably dimensioned for the surface-wave device. The voltage divider ratio can in practice be dimensioned up to 1:1000 straightforwardly. For example, the capacitance C1 is approximately 2 nF for a sleeve 7 with a longitudinal dimension of 0.1 m and a diameter of approximately 24 mm (with a 22 mm diameter of the conductor 2). The associated stray capacitance C2 is, for example, approximately 9 pF. An additional capacitance C3 which occurs between the line 2 and a neighbouring line 2' is approximately 4 pF for such an example. Merely for completeness, it should be pointed out that, in FIGS. 1 and 2, the distances between the line 2 and the base potential 10, on the one hand, and a second line 2' which is possibly present, on the other hand, are represented reduced by several orders of magnitude.

The surface-wave device does not require or operate without a (further) power supply source.

FIG. 2 shows the side view corresponding to FIG. 1. Reference marks given in FIG. 2 have the meanings described with reference to FIG. 1.

The surface-wave device 21 provided according to the invention is, as claimed, arranged in the electric field of the capacitor C1, in such a way that, in at least a portion of the substrate body of this surface-wave device, such an electric field occurs as is proportional to the electrical voltage between the line 2 and the base potential 10, that is to say proportional to the electrical (part) voltage to be measured. Further design details of this are given in the following embodiments.

Figure 4:
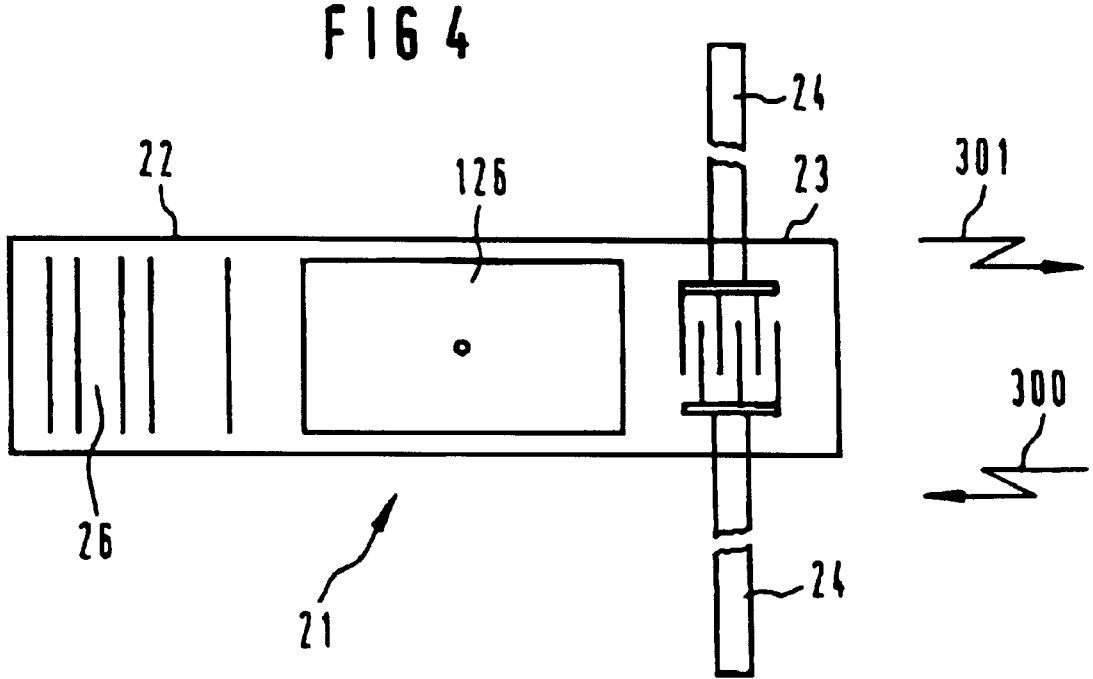

An illustrative embodiment of a surface-wave device used in the invention is described with reference to FIGS. 3 and 4. As one of its essential components, the surface-wave device 21 comprises a substrate body 22. The latter is preferably a wafer, which in most cases consists of piezoelectric, preferably monocrystalline, material. In particular, such a wafer 22 consists of quartz, lithium niobate, lithium tantalate or the like. The wafer 22 may, however, also be configured in such a way that it only zonally has piezoelectric, and at the least electrostrictive, properties, at least as and where required for electrically producing an acoustic wave or for converting such a wave back into an electric signal. An acoustic (mechanical) wave produced by means of an interdigital transducer 23 known for such devices, and subsequently propagating in the wafer in the substrate body 22, is indicated by 25 in the Figures. In the represented example of a surface-wave device 21, 26 denotes a reflector which, correspondingly configured in known fashion, reflects the wave 25 back again into the interdigital transducer 23.

The reflector may also, for example, in a manner known in principle be coded and thereby lead to a correspondingly coded response signal of the surface-wave device.

The known mode of operation of such a surface-wave device 21 consists in that the wave 25 is produced in the transducer 23 by means of an electric pulse fed via the antenna 24 from an interrogation transmitter on the radio link 300, and the reflected wave is converted back again into an electric signal in the same transducer 23. This reconverted electric signal 301 is transmitted via the antenna 24, received by a reception station and evaluated there. In the case of an overhead electrical line, a transmission station located on the ground and a reception station, likewise located on the ground and having an evaluation part, are provided for this purpose.

For transmission to and from the antenna 24, a coupling slot may, for example, be provided in the wall of a sleeve 7 which is closed (for example by means of insulating or dielectric end caps). A closed sleeve is provided in particular if a gas, for example SF6, which promotes electrical insulation is intended to be contained in its interior, in the case of correspondingly high electrical voltages. The abovementioned coupling slot should then be correspondingly closed off dielectrically. For insulation in the interior of the sleeve, another appropriate insulator may also be used. The ends of the antenna 24 may be fed out of the sleeve, for example through the end faces of the sleeve. It is also possible to couple the overhead line 2 itself as the antenna.

The electrostrictive, preferably piezoelectric, property is also present in the region of the electrodes 126 and 226, which are arranged, opposite one another, preferably directly on the top or bottom of the substrate wafer 22, as in a plate capacitor. For the sake of completeness, it should be pointed out that it may be sufficient for the invention to use a substrate body 22 which is not electrostrictive (not piezoelectric) but which is then coated with an electrostrictive (piezoelectric) layer in the region of the interdigital transducer 23 and the electrode 126 (possibly also 226).

A preferred embodiment of the invention is one in which the electrode 126 is electrically conductively connected to the conductor 2 and the electrode 226 is electrically conductively connected to the surface element 7 (or vice versa). The voltage of the capacitor C1 in FIGS. 1 and 2 is thereby applied to the electrodes 126 and 226, that is to say the predetermined voltage fraction of the total voltage, existing between the line 2 and the potential 10, which is to be measured.

The effect of the piezoelectric or at least the electrostrictive properties of the material of the substrate body 22 (or of the layer located thereon) produces, according to the amplitude of the electrical voltage applied between the electrodes 126 and 226, a correspondingly varying electrostriction effect in the material, in which the acoustic wave 25 propagates (in both directions) in the device 21. This physical effect leads to a time-of-flight change of the wave 25, depending on the electrostriction and therefore on the applied electrical voltage, with regard to the time-of-light of this wave from the transducer 23 to the reflector 26 and back again to the transducer 23. This change from the time at which the response signal 310 is transmitted back, with reference to the pulsed excitation signal 300, can be evaluated as a measure of the electrical voltage applied to the capacitor C1, and therefore as a measurement value of the electrical voltage between the line 2 and the base potential 10.

According to the voltage division, already mentioned above, between the capacitors C1 and C2, it is possible to select, for the surface-wave device 21 to be used, a voltage range which is suitably matched to the expected voltage range of the voltage to be measured. In this case, a further substantially freely selectable parameter is the thickness of the substrate body 22 between the electrodes 126 and 226. The thickness of this body 22 is dimensioned, in known fashion, while taking into account the requisite mechanical stability, on the one hand, and the price of the material, on the other hand.

Such a surface-wave device is fitted, in a manner which is conventional (and accordingly not separately represented) in a housing which is hermetically sealed from the surroundings and has the necessary electrical lead-throughs for the dipole halves 24 of the antenna and the electrical connections to the electrodes 126 and 226. In a surface-wave device used according to the invention, the relevant range of applied electrical voltages for the capacitor C1 is between . . . and . . . volts. Such voltages constitute no problem for electrical insulation at the housing of the surface-wave device. There are likewise no insulation problems in the invention with regard to fitting the surface element or the sleeve 7. The major part of the voltage drop is across the stray (air) capacitant C2, for which there is no insulation problem worth mentioning other than the general insulation problem for medium/high-voltage live conductors 2, for example the overhead line (this problem being in practice usually solved). However, this voltage division demands a high measurement accuracy at the capacitor C1, but this is ensured with the invention.

In the present context, the term "surface wave" should not be understood only in the strict sense of Rayleigh, Bleustein and similar waves, but should also be taken to include other acoustic waves which can equally be used for achieving the object of the invention, for example body waves, shear waves and the like, specifically as they are used in known fashion in such devices.

The solution according to the invention, that is to say the voltmeter according to the invention, demands that the influence on the measurement result directly obtained, due to neighboring current-carrying/live conductors such as parallel conductors of multi-conductor systems, be taken into account. This is done by simultaneously taking measurements from such neighbouring conductors, for example the other phases of a three-phase system. Since the capacitances with respect to these neighbouring lines are known (or can be calculated), it is within the context of the invention to eliminate the respective influence by computing and to determine the actual/true voltage value according to the object of the invention.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A voltmeter, comprising:
a capacitive voltage divider provided between an electrical conductor and an electrical base potential said electrical conductor having an electrical potential to be measured relative to the electrical base potential;
an electrically conductive surface element having predetermined surface dimensions which are arranged at a distance from and in a vicinity of the electrical conductor such that the electrically conductive surface element forms an electrical potential surface of the capacitive voltage divider;
a surface-wave device having a substrate body said substrate body being at least in part of a material having an electrostrictive property, said surface-wave device being arranged in an electric field existing between the electrical conductor and said electrically conductive surface element, said surface-wave device inducing a voltage-dependent effect on a time of duration of a wave propagating forward and back in said surface-wave device; and
a transmission, reception and evaluation device assigned to said surface-wave device.

2. The voltmeter according to claim 1, wherein the surface-wave device has a transducer and, connected thereto, an antenna which is coupled via a radio link to an assigned interrogation transmitter device for electrical pulses to produce the surface-wave, and via the radio link to the assigned reception and evaluation device for receiving the signal converted back, these interrogation transmitter and reception devices being arranged at the base potential location.

3. The voltmeter according to claim 1, wherein the surface-wave device is a surface-wave time-of-duration arrangement.

4. The voltmeter according to claim 1, wherein at least one electrode is arranged on the substrate in region of a propagation path of the wave.

5. The voltmeter according to claim 1, wherein the surface-wave device has a substrate consisting of electrostrictive material.

6. The voltmeter according to claim 1, wherein the surface-wave device has a substrate having a coating of electrostrictive material.

7. The voltmeter according to claim 5, wherein the electrostrictive material is piezoelectric material.

8. The voltmeter according to claim 1 wherein the surface element is a sleeve having a predetermined diameter and predetermined axial length, surrounding the conductor at a distance.

9. The voltmeter according to claim 8, wherein said sleeve includes portions which define a slot.

10. The voltmeter according to claim 1, further comprising: a system having a plurality of adjacent further high/medium-voltage conductors, said voltmeter being provided on one of said conductors, further voltmeters being provided on neighboring ones of said further high/medium voltage conductors, and wherein a true measurement value for an individual one of said conductors is determined in an evaluation device by eliminating influence by neighboring conductors using measurement values of said further conductors.

* * * * *